(12) United States Patent
Takehiko et al.

(10) Patent No.: US 8,330,187 B2
(45) Date of Patent: Dec. 11, 2012

(54) GAN-BASED FIELD EFFECT TRANSISTOR

(75) Inventors: Nomura Takehiko, Tokyo (JP); Sato Yoshihiro, Tokyo (JP); Kambayashi Hiroshi, Tokyo (JP); Kaya Shusuke, Tokyo (JP); Iwami Masayuki, Tokyo (JP); Kato Sadahiro, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 51 days.

(21) Appl. No.: 12/627,436

(22) Filed: Nov. 30, 2009

(65) Prior Publication Data

US 2010/0148184 A1    Jun. 17, 2010

(30) Foreign Application Priority Data

Dec. 16, 2008    (JP) .................... 2008-320019

(51) Int. Cl.
*H01L 29/66* (2006.01)
(52) U.S. Cl. ........ 257/192; 257/188; 257/189; 257/194; 257/195; 257/190; 257/289; 257/201; 257/207
(58) Field of Classification Search .................... 257/76, 257/188–189, 194, 195, 190, 201, 192, 207, 257/289
See application file for complete search history.

(56) References Cited

U.S. PATENT DOCUMENTS

| | | | |
|---|---|---|---|
| 6,849,882 B2 * | 2/2005 | Chavarkar et al. | 257/191 |
| 7,038,253 B2 * | 5/2006 | Yoshida et al. | 257/192 |
| 7,432,538 B2 * | 10/2008 | Kosaki et al. | 257/194 |
| 7,459,718 B2 * | 12/2008 | Hayamura et al. | 257/12 |
| 7,812,371 B2 * | 10/2010 | Kaya et al. | 257/192 |
| 2004/0201038 A1 * | 10/2004 | Kimura et al. | 257/192 |
| 2008/0079009 A1 * | 4/2008 | Yaegashi | 257/77 |

FOREIGN PATENT DOCUMENTS

WO    03071607 A1    8/2003

OTHER PUBLICATIONS

Yen-Kuang Kuo and Wen-Wie Lin, Band-Gap Bowing Parameter of the AlxGa1-xN Drived from Theoretical Simulation, Jan. 2002, Journal Applied Physic, vol. 41 (2002) pp. 73-74.*
W. Huang, et al., "Enhancement-Mode n-Channel GaN MOSFETs on p and n-GaN/Sapphire Substrates", IEEE Electron Device Letters, vol. 27, No. 10, Oct. 2006, 3 pages.

* cited by examiner

*Primary Examiner* — Steven Loke
*Assistant Examiner* — Cuong Nguyen
(74) *Attorney, Agent, or Firm* — Turocy & Watson, LLP

(57) ABSTRACT

A GaN-based field effect transistor (MOSFET) is comprised of a channel layer comprised of p-type GaN, an electron supply layer, a surface layer having band gap energy smaller than that of the electron supply layer, sequentially laminated on a substrate, and recess section is formed by removing a part of the drift layer, the electron supply layer, and the surface layer down to a depth that reaches to the channel layer. A source electrode and a drain electrode are formed so that the recess section positions between them, a gate insulation film is formed on the surface layer and on inner-surface of the recess section including the channel layer, and a gate electrode is formed on the gate insulating film in the recess section.

12 Claims, 9 Drawing Sheets

GAN-BASED FIELD EFFECT TRANSISTOR

CROSS-REFERENCE TO RELATED APPLICATION

This application claims priority to Japanese patent application serial No. 2008-320019, filed on Dec. 16, 2008, the entire content of which is incorporated herein by the reference.

BACKGROUND OF THE INVENTION

1. Field of the Invention

The present invention relates to GaN-based field effect transistor comprising nitride-based compound semiconductor for use in devices for power electronics and devices for high frequency amplification, and manufacturing process thereof.

2. Description of the Related Art

Since wide band gap semiconductors represented by III-V group nitride-based compound semiconductors exhibit high breakdown filed, good electron transferring characteristics, and good thermal conductivity, they are highly expected as semiconductor devices for high temperature environment, high power, or high frequency. For instance, AlGaN/GaN hetero junction structure involves generation of two-dimensional electron gas at the boundary due to the spontaneous polarization and the Piezo effect. This two-dimensional electron gas has high electron mobility and carrier density, and it is already made available as a device for high frequency. The hetero junction field effect transistor (HFET) employing AlGaN/GaN hetero-structure has low on-resistance and fast switching speed, and operates in high temperature. These characteristics are very suitable in applications for high power switching elements.

Typical AlGaN/GaN HFETs are normally-on type devices in which drain current flows when there is no bias applied to the gate and in which drain current is blocked by applying negative voltage at the gate. In contrast, in high power switching elements, due to securing safety in case the device breaks down, normally-off type devices are preferable in which electric current does not flow when bias (positive voltage) is not applied to the gate and in which electric current flows when positive voltage is applied to the gate.

In order to achieve a normally-off type device, there is a need to adopt MOS structure and studies are conducted in several research organizations (e.g., Non-Patent Document 1). In a structure in the Non-Patent Document 1, n-type layer between a gate and a drain is formed by ion implantation. However, according to the current technology, it is difficult to reduce resistance of n-type layer formed with ion implantation, and it is difficult to accomplish both low resistance and high breakdown voltage.

On the other hand, Patent Document 1 shows a metal-oxide semiconductor field effect transistor (MOSFET) of MOS structure wherein an electron supply layer comprising AlGaN, etc., is etched off at the gate section down to a channel layer and an insulating layer is formed on the etching surface of the channel layer. As regards this structure, space between the gate and the drain is formed of a hetero junction structure comprising AlGaN/GaN, and since the two-dimensional electron gas that is generated due to the hetero junction boundary has high electron mobility, it can avoid increase in on-resistance even if sheet carrier concentration is low, which is needed for maintaining high breakdown voltage. That is, it is a structure suitable for achieving high breakdown voltage with low on-resistance.

[Patent Document 1] International Patent Application WO 03/071607 Publication

[Non-Patent Document 1] Huang W, Khan T, Chow T P: Enhancement-Mode n-Channel GaN MOFETs on p and n-GaN/Sapphire substrates. In: 18th International Symposium on Power Semiconductor Devices and ICs (ISPSD) 2006 (Italy), 10-1.

However, since the AlGaN/GaN hetero junction structure is influenced by a phenomenon called, "current collapse" in which drain current changes with the passage of time with respect to applied voltage, there will be adverse effects upon features of the device such as an increase in on-resistance following application of high voltage between the gate and the drain, an increase in on-resistance at the time of forward flow of current, etc.

As regards the cause of the current collapse, the carrier traps between HFET AlGaN layer and the surface protection film and the carrier traps within semiconductor layer that constitute the element are believed to influence it.

SUMMARY OF THE INVENTION

It is an object of the present invention to at least partially solve the problems in the conventional technology.

A GaN-based field effect transistor according to an aspect of the invention is comprised of: a substrate; a channel layer comprised of p-type GaN-based compound semiconductor material formed on the substrate; an electron supply layer formed on the channel layer and comprised of GaN-based compound semiconductor material which has band gap energy greater than that of the channel layer; a surface layer formed on the electron supply layer and is comprised of GaN-based compound semiconductor material having band gap energy smaller than that of the electron supply layer; an insulating film formed on the surface layer and on inner surface of recess section having a surface of the channel layer that was exposed by removing a part of the surface layer and the electron supply layer as a bottom surface; a gate electrode formed on the insulating film of the recess section; and a source electrode and a drain electrode electrically connected to the channel layer and formed so that the gate electrode positions between them.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
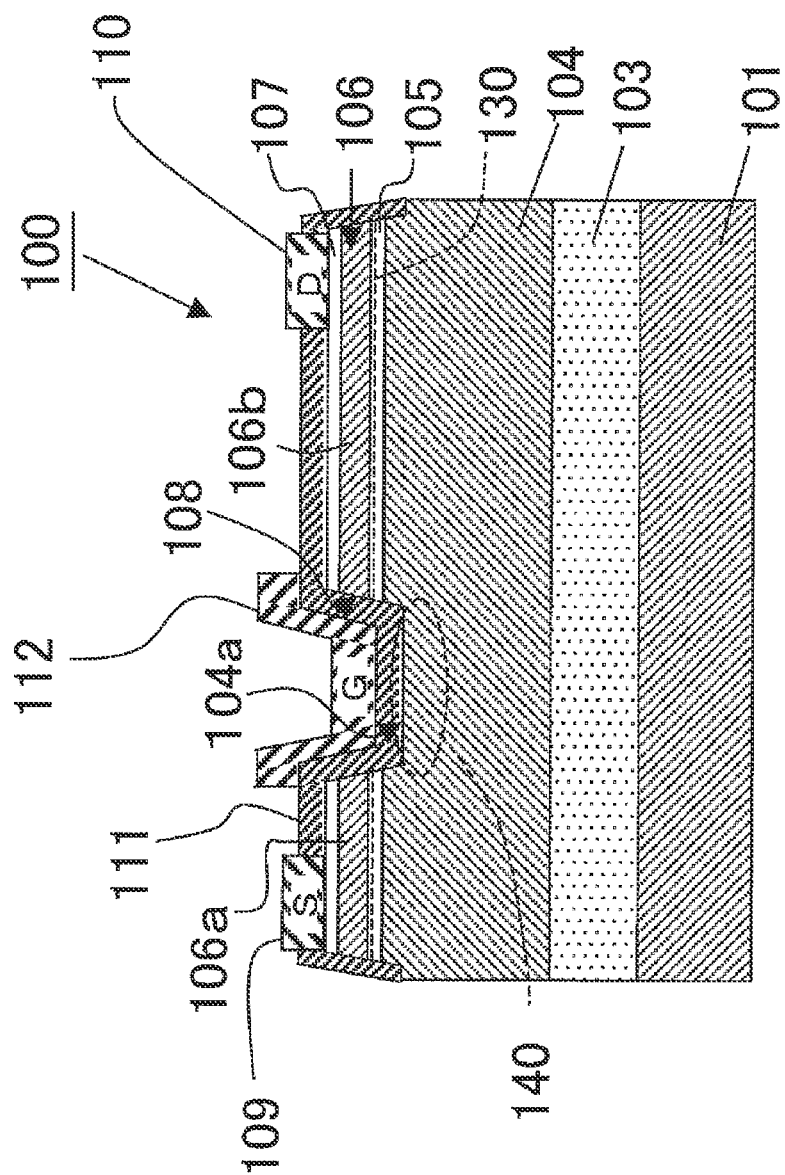
FIG. 1 schematically shows a cross sectional view of a MOSFET according to first embodiment of the invention.

Embodiments embodying the invention are described referring to the drawings. Upon describing each embodiment, duplication has been avoided by adding a similar symbol for a similar part.

(First Embodiment)

FIG. 1 is a schematical cross-sectional diagram of GaN-based MOS-type field effect transistor (hereinafter called, "MOSFET") according to a first embodiment of the invention. In the MOSFET 100, on a substrate 101 comprising sapphire, SiC, Si, etc., a buffer layer 103 that is formed by alternate lamination of GaN layer and AlN layer, and a channel layer 104 comprising p-GaN or undoped GaN are formed. Further, a drift layer 105 comprising undoped GaN (u-GaN), an electron supply layer 106 comprising AlGaN whose band gap energy is greater than that of the GaN-based semiconductor material of the drift layer 105, and a surface layer 107 comprising u-GaN are sequentially laminated on the channel layer 104, and thereafter, a portion of the drift layer 105, the electron supply layer 106, and the surface layer 107 has been removed down to depth of the channel layer 104 to create an opening, and thereby, a recess section 108 is formed.

In addition, a source electrode 109 and a drain electrode 110 are formed on the surface layer 107 so that the recess section 108 positions between the two. A gate insulation film 111 comprising $SiO_2$ is formed on the surface layer 107 and on inner-surface of the recess section 108 including the surface 104a of the channel layer 104, and a gate electrode 112 is formed on the gate insulating film 111 in the recess section 108. Moreover, while the surface 104a of the channel layer 104 that is inside the recess section 108 is located in the vicinity of the upper surface of the channel layer 104 in the drawing, the depth of that surface 104a can be set suitably inside the channel layer 104. Moreover, a part on the surface layer 107 of the gate insulating film 111 constitutes a protective film.

Thus, the electron supply layer 106 in MOSFET 100 has the first electron supply layer 106a and the second electron supply layer 106b that are mutually segregated on both sides of the gate portion of MOS structure composed of the channel layer 104, the gate insulating film 111 and the gate electrode 112, directly under the gate insulating film 111. A drift layer 105 comprising p-type or undoped GaN-based compound semiconductor whose impurity density is lower than that of the channel layer 104 is formed respectively between the channel layer 104, and the first electron supply layer 106a and the second electron supply layer 106b.

As regards the MOSFET 100, since the first electron supply layer 106a and the second electron supply layer 106b respectively form hetero junction on the surface of left and right drift layers 105 of the gate section, two-dimensional electron gas layer 130 is formed in the vicinity of the boundary. Consequently, the two-dimensional electron gas layer 130 acts as carrier, and the drift layer 105 exhibits electrical conductivity. By means of this two-dimensional electron gas layer 130, reduction of channel resistance, i.e., on-resistance of the MOSFET 100, is enabled.

Moreover, as regards the MOSFET 100, since the electron supply layer 106 is not present in the area directly under the gate electrode 112 of the channel layer 104, two-dimensional electron gas layer is not formed. When positive voltage greater than or equal to threshold is applied to the gate electrode, an inversion layer 140 is formed in the channel layer 104 directly below the gate electrode 112. This inversion layer 140 connects with the two-dimensional gas layer 130 that was formed in the channel layer 104 at left and right of the gate section, and thereby, the drain current flows. Thus, the operation of a normally-off type field effect transistor can be obtained.

In the following, a method for manufacturing the MOSFET 100 will be described. FIGS. 2-6 are schematic diagrams illustrating a method for manufacturing the MOSFET 100. Furthermore, given below are descriptions of a case employing a metal-organic chemical vapor deposition (MOCVD) method but the invention is not limited to this method.

Figure 2:
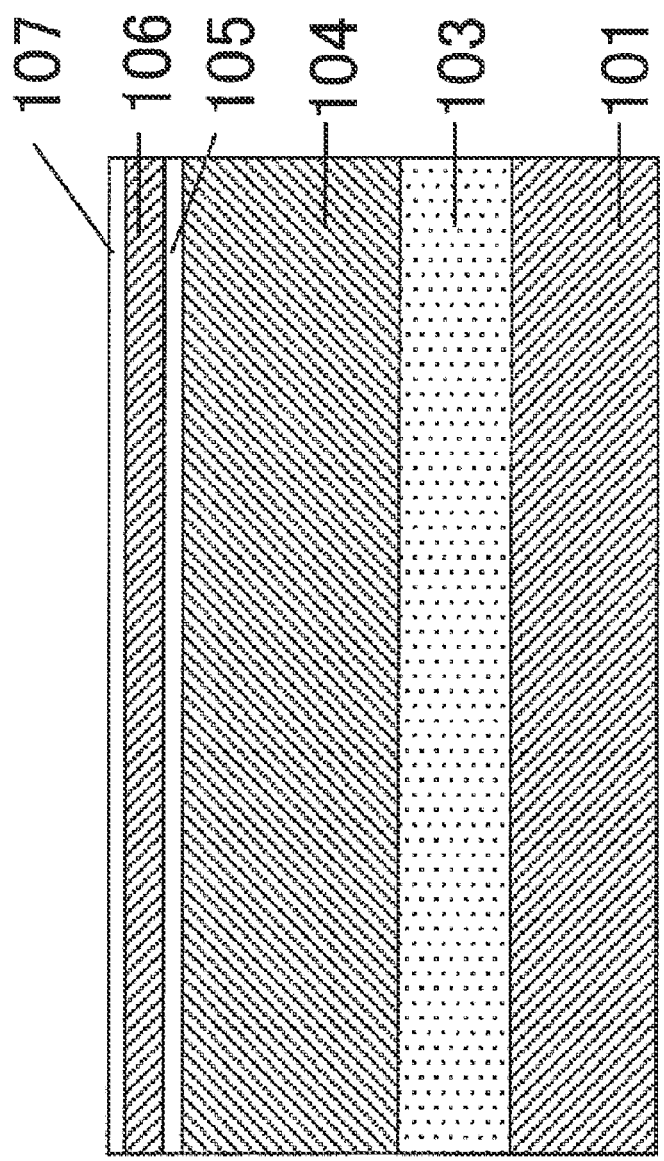
FIG. 2 shows an illustration of an example of a method for manufacturing a MOSFET shown in FIG. 1.

To start with, as shown in FIG. 2, a substrate 101 comprising Si having (111) surface as the main surface is set to the MOCVD device, and hydrogen gas with 100% concentration is used as the carrier gas, trimethyl gallium (TMGa), trimethyl aluminium (TMAl) and $NH_3$ are introduced, and the buffer layer 103, and the channel layer comprising p-GaN are epitaxial grown sequentially on the substrate 101 at growth temperature 1050° C. Furthermore, Bis(cyclopentadienyl) magnesium ($Cp_2Mg$) is employed as p-type doping source against the channel layer 104, and the flow of $Cp_2Mg$ is regulated in such a way that the concentration of Mg is about $1 \times 10^{17}$ cm$^{-3}$.

Then, TMGa and $NH_3$ are respectively introduced, and the drift layer 105 comprising undoped GaN is epitaxial grown on the channel layer 104 at growth temperature 1050° C. Then, TMAl, TMGa and $NH_3$ are respectively introduced, and the electron supply layer 106 comprising AlGaN having Al composition ratio of about 25%, is epitaxial grown. Then, TMGa and $NH_3$ are respectively introduced, and the surface layer 107 is epitaxial grown on the electron supply layer 106.

Furthermore, as regards what is stated above, the buffer layer 103 consists of eight laminated layers of GaN/AlN compound layers having thickness 200 nm/20 nm, respectively. Moreover, the thickness of the AlN layer 102, the channel layer 104, the drift layer 105, the electron supply layer 106, and the surface layer 107 is 100 nm, 500 nm, 100 nm, 20 nm, and 20 nm, respectively.

Figure 3:
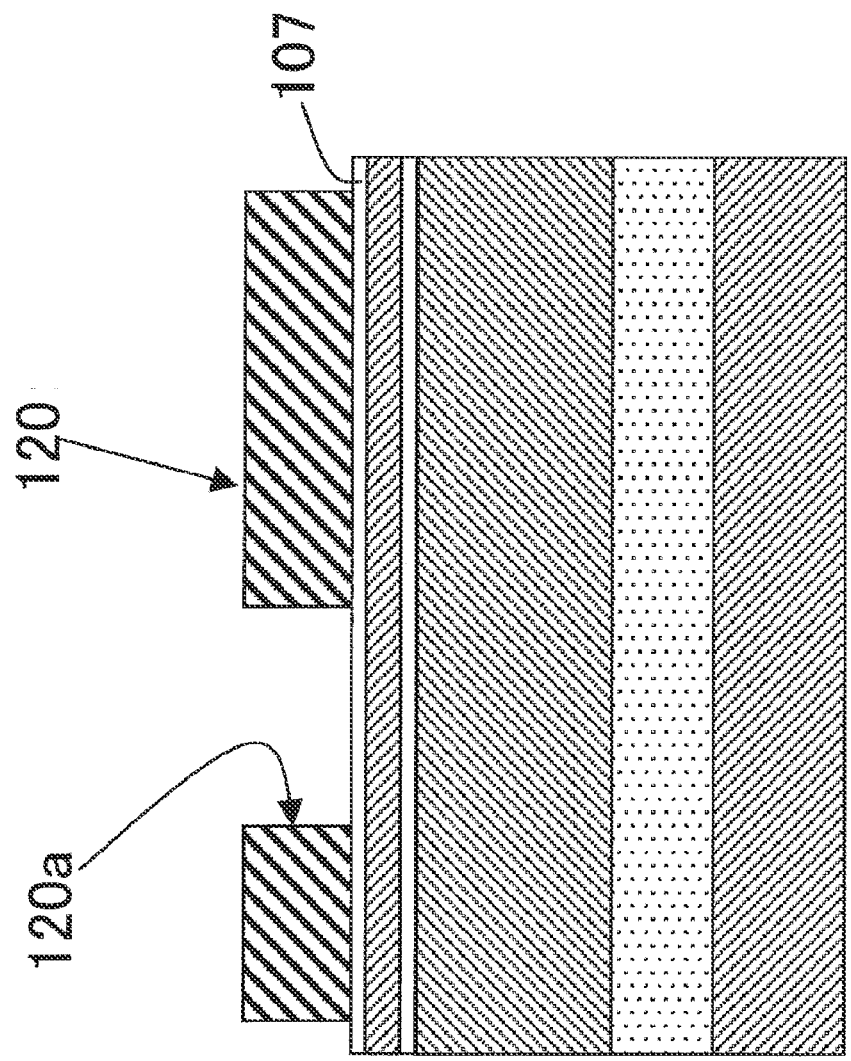
FIG. 3 shows an illustration of an example of a method for manufacturing the MOSFET shown in FIG. 1.

In the following, as shown in FIG. 3, a mask layer 120 comprising $SiO_2$ having 500 nm thickness is formed on the electron supply layer 107, using plasma chemical vapor deposition (PCVD) method, and then patterning is done employing photolithography and $CF_4$ gas, and the opening section 120a is formed.

Figure 4:
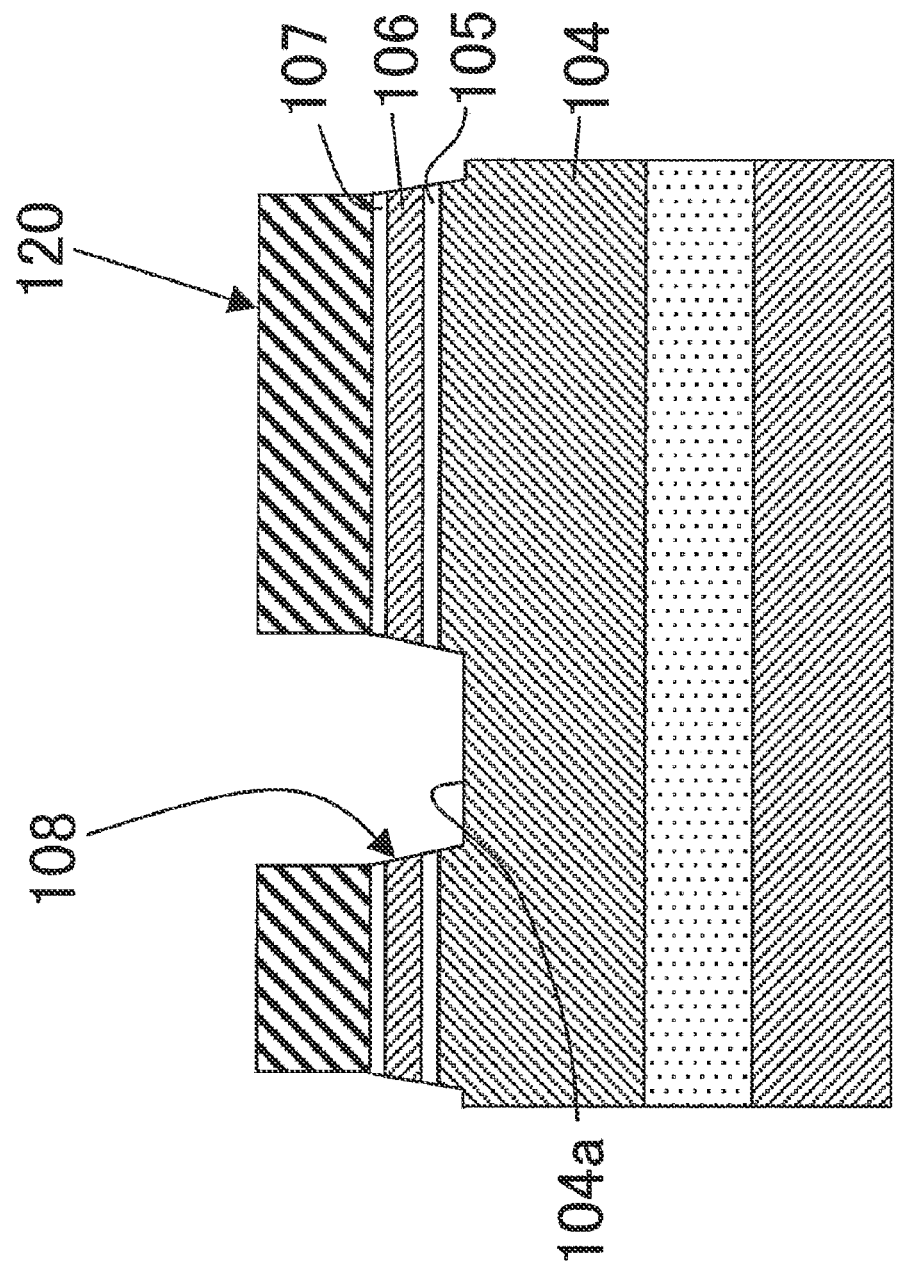
FIG. 4 shows an illustration of an example of a method for manufacturing the MOSFET shown in FIG. 1.

Then, as shown in FIG. 4, using the mask layer 120 as the mask, $Cl_2$ gas is employed to remove a portion of the channel layer 104, the drift layer 105, the electron supply layer 106, and the surface layer 107 with etching, thus the recess section 108 is formed, in which its bottom extends to the vicinity of the surface of the channel layer 104.

Figure 5:
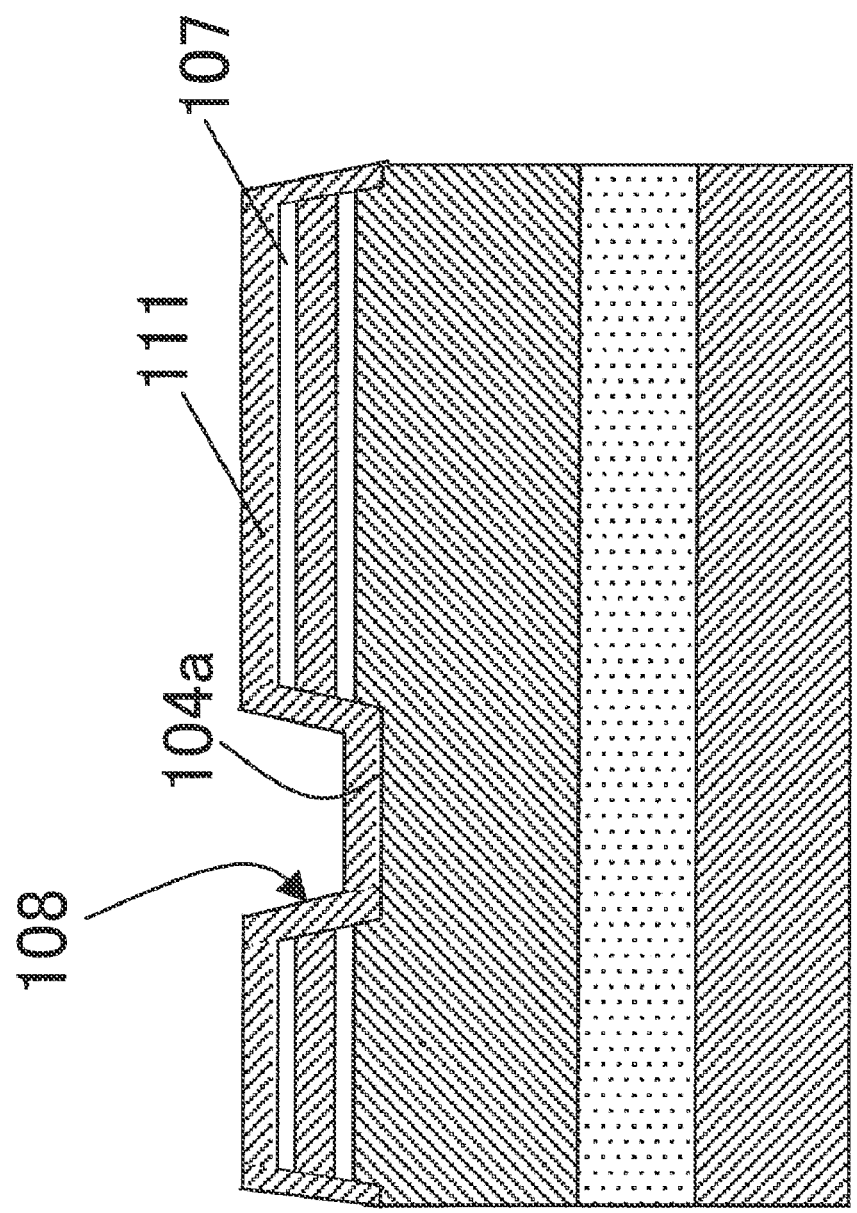
FIG. 5 shows an illustration of an example of a method for manufacturing the MOSFET shown in FIG. 1.

In the following, as shown in FIG. 5, the mask layer 120 is removed, and the gate insulating film 111 comprising $SiO_2$ having thickness of 60 nm, that extends on the surface layer 107 as well as on inner surface of the recess section 108 including the surface 104a of the channel layer 104, is formed employing the PCVD method involving $SiH_4$ and $N_2O$ as raw material gases.

Figure 6:
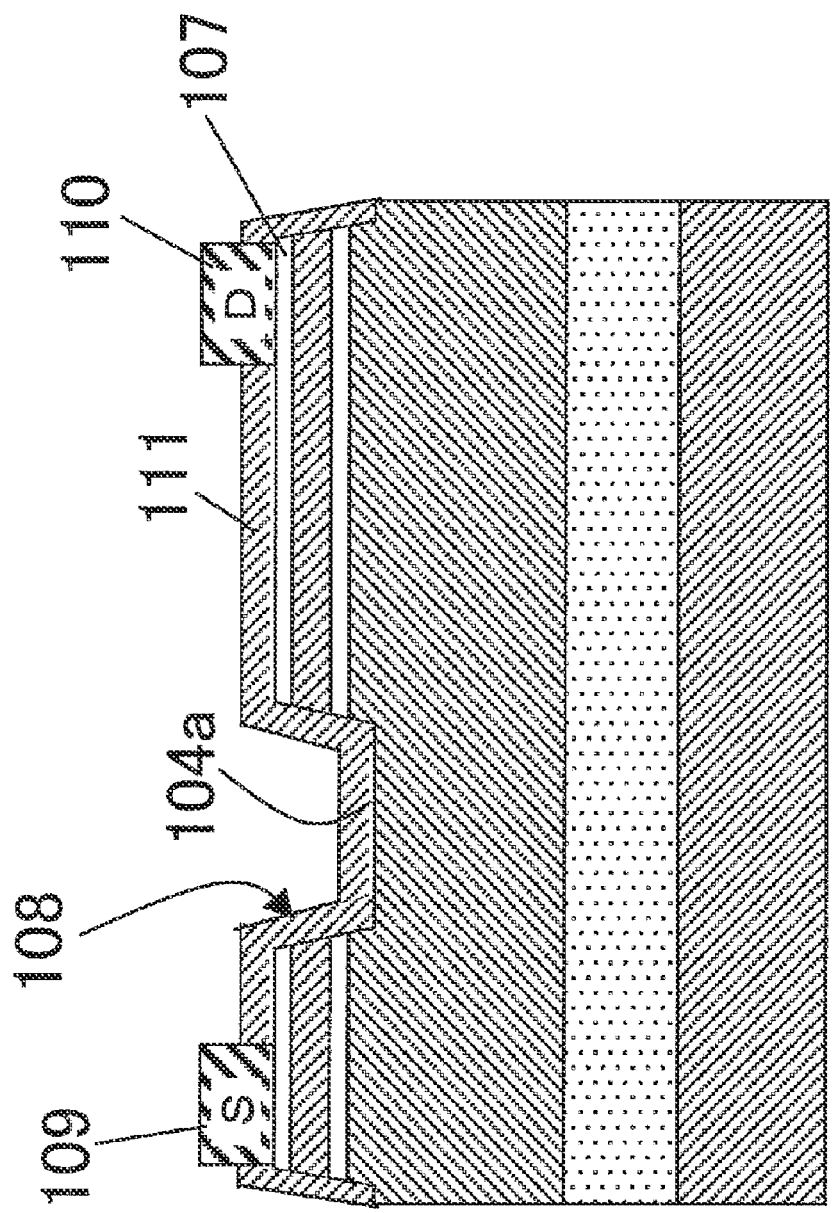
FIG. 6 shows an illustration of an example of a method for manufacturing the MOSFET shown in FIG. 1.

Thereafter, as shown in FIG. 6, a portion of the gate insulating film 111, which corresponds to the left and right surface layer 107 of the recess section 108, is removed with fluoric acid, and the source electrode 109 and the drain electrode 109 are formed on the surface layer 107, using a lift-off method. Moreover, the structure of both the source electrode 109 and the source electrode 110 is Ti/Al structure having 25 nm/300 nm thickness. As regards formation of a metal film, it can be achieved using sputtering method or vacuum vapor deposition method. Then, after having formed the source electrode 109 and the drain electrode 110, annealing is carried out for 10 minutes under 600° C.

Thereafter, the MOSFET 100 as shown in FIG. 1 is completed by forming the gate electrode 112 having Ti/Al structure in the recess section 108, by using the lift-off method. By means of the above manufacturing steps, a MOSFET 100 according to a first embodiment of the invention is manufactured.

The MOSFET 100 according to a first embodiment accomplishes following functions and advantageous effects:

The surface layer 107 comprising GaN-based compound semiconductor whose band gap energy is lower than that of the GaN-based semiconductor material of the electron supply layer 106 is formed on the electron supply layer 106, and the insulating film (a portion on the surface layer 107 of the gate insulating film 111) is formed on the surface layer 107. Therefore, surface trap density is decreased compared with a case where an insulating film is directly formed on the electron supply layer 106, and thereby, it is able to suppress the occurrence of the electron collapse. Thus, a field effect transistor is accomplished, which has high breakdown voltage, low on-resistance, and is not easily influenced by characteristics changes due to electric current collapse.

Further, since insulation membrane (gate insulation membrane 111) is formed on the inner surface of recess section, which has the surface of channel layer 104 that was exposed after removing a part of the surface layer 107 and the electron supply layer 106, on both sides of gate portion, a two-dimensional electron gas layer 130 of high concentration is formed directly below the hetero junction interface of the electron supply layer 106 and the channel layer 104, and thereby, channel resistance, i.e., on-resistance of field effect transistor, is advantageously reduced. Furthermore, since the hetero junction structure with the electron supply layer 106 is not formed, a two-dimensional electron gas layer is not formed in the channel layer 104 directly below the gate electrode 112. For this reason, in case positive voltage is not applied to the gate electrode 112, since the two-dimensional electron gas layers 130 formed on both sides of the gate portion are not connected to each other, there is no flow of drain current. When voltage greater than or equal to threshold is applied to the gate electrode in forward direction, an inversion layer 140 is formed in the channel layer 104 just below the gate electrode 112. This inversion layer 140 connects with the two-dimensional gas layer 130 that was formed in the channel layer 104 at both sides of the gate portion, and thereby, the drain current flows. Accordingly, the operation of the field effect transistor of normally off type can be obtained.

In the MOSFET 100, the drift layer comprising p-type or undoped GaN-based compound semiconductor material whose band gap energy is smaller than that of the electron supply layer and the impurity density is lower than that of the channel layer forms hetero junction with the electron supply layer, and high concentration two-dimensional electron gas layer is formed in the vicinity of the surface of the drift layer. Since p-type impurity concentration of the drift layer is lower than that of the channel layer, reduction of channel resistance, i.e., on-resistance of the field effect transistor, is further accomplished, and thereby, low on-resistance and high speed switching operation are achieved.

(Second Embodiment)

In the following, a MOSFET according to a second embodiment of the present invention will be described. The MOSFET according to the second embodiment of the invention has the surface layer comprised of n-type GaN, and the rest of the structure is the same with the MOSFET 100. In order to obtain such a surface layer, $SiH_4$ is employed as n-type doping source, and the flow of $SiH_4$ is regulated in such a way that the concentration of Si is about $1 \times 10^{18}$ $cm^{-3}$.

The MOSFET 100 according to the second embodiment of the invention accomplishes following functions and advantageous effects in addition to those of the first embodiment. The MOSFET is able to reduce Ohmic contact resistance between the source electrode or the drain electrode, and the surface layer, by making the surface layer in which insulating film is formed as n-type doped GaN layer.

(Third Embodiment)

Figure 7:
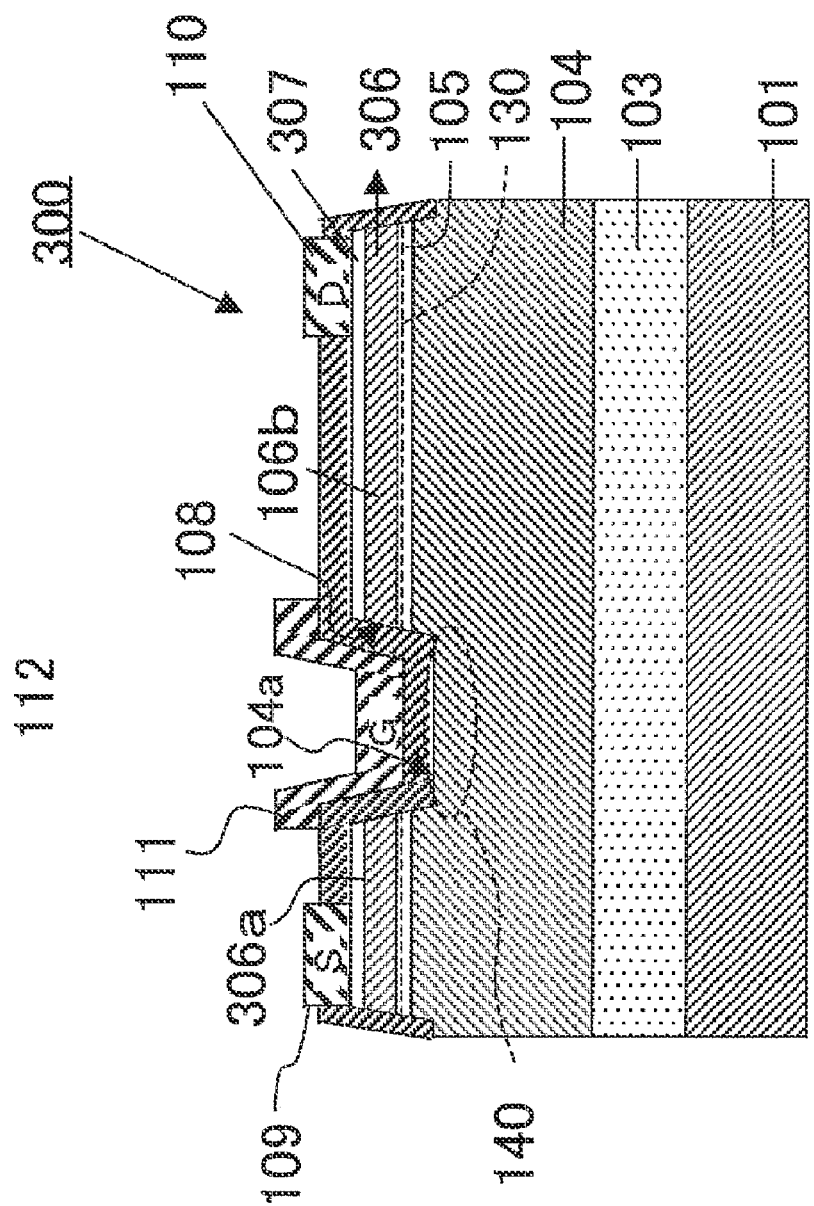
FIG. 7 schematically shows a cross sectional view of a MOSFET according to third embodiment of the invention.

In the following, a MOSFET 300 according to a third embodiment of the present invention will be described. FIG. 7 schematically shows a cross sectional view of a MOSFET 300 according to the third embodiment of the invention. The MOSFET 300 has a surface layer 307 comprised of AlGaN, and its Al composition ratio of the surface layer 307 is smaller than that of an electron supply layer comprised of AlGaN, but the rest of the structure is the same with the MOSFET 100 of the first embodiment. In order to obtain such a surface layer 307, an electron supply layer 306 comprising AlGaN having Al composition ratio 25%, is epitaxial grown on the drift layer 105, and a surface layer 307 comprising AlGaN having Al composition ratio 5%, is epitaxial grown on the electron supply layer 306.

The MOSFET 300 according to the third embodiment of the invention accomplishes following functions and advantageous effects in addition to those of the first embodiment. By using AlGaN with Al composition ratio smaller than that of electron supply layer 306 as the surface layer 307, reduction in trap density between the surface layer 307 and the gate insulating film 111 is accomplished and current collapse is advantageously decreased. The Al composition ratio of AlGaN to be used as the surface layer 307 is preferably, greater than 0% and smaller than or equal to 15%.

(Fourth Embodiment)

Figure 8:
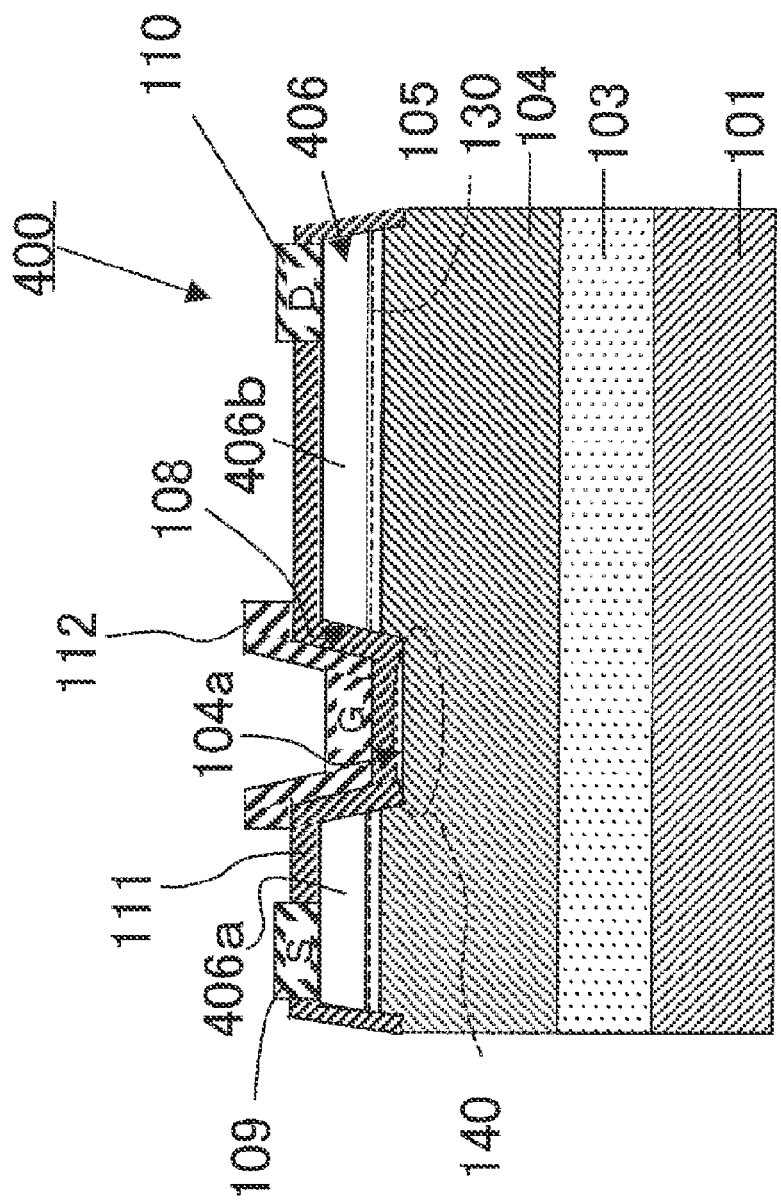
FIG. 8 schematically shows a cross sectional view of a MOSFET according to fourth embodiment of the invention.

In the following, a MOSFET 400 according to a fourth embodiment of the present invention will be described. FIG. 8 schematically shows a cross sectional view of a MOSFET 400 according to the fourth embodiment of the invention. As shown in FIG. 8, a MOSFET 400 has an electron supply layer 406, which is comprised AlGaN in which Al composition ratio gradually decreases from the substrate 401 side, and the surface side of the electron supply layer 406 serves as a surface layer also. The Al composition ratio of the electron supply layer 406 is preferably, 15-25% at the substrate 406 side and 0-15% at the surface side. Such electron supply layer 406 is obtained by adjusting the amount of raw material gas flow during the growth, in particular, by decreasing the amount of TMA flow with passage of time.

By arranging as such, the electron supply layer 406 configures hetero junction structure between itself and the drift layer and generates two-dimensional electron gas layer at the substrate 406 side, and decreases trap density between itself and the insulating film (gate insulating film 411) by serving as a surface layer also at the surface side.

(Fifth Embodiment)

Figure 9:
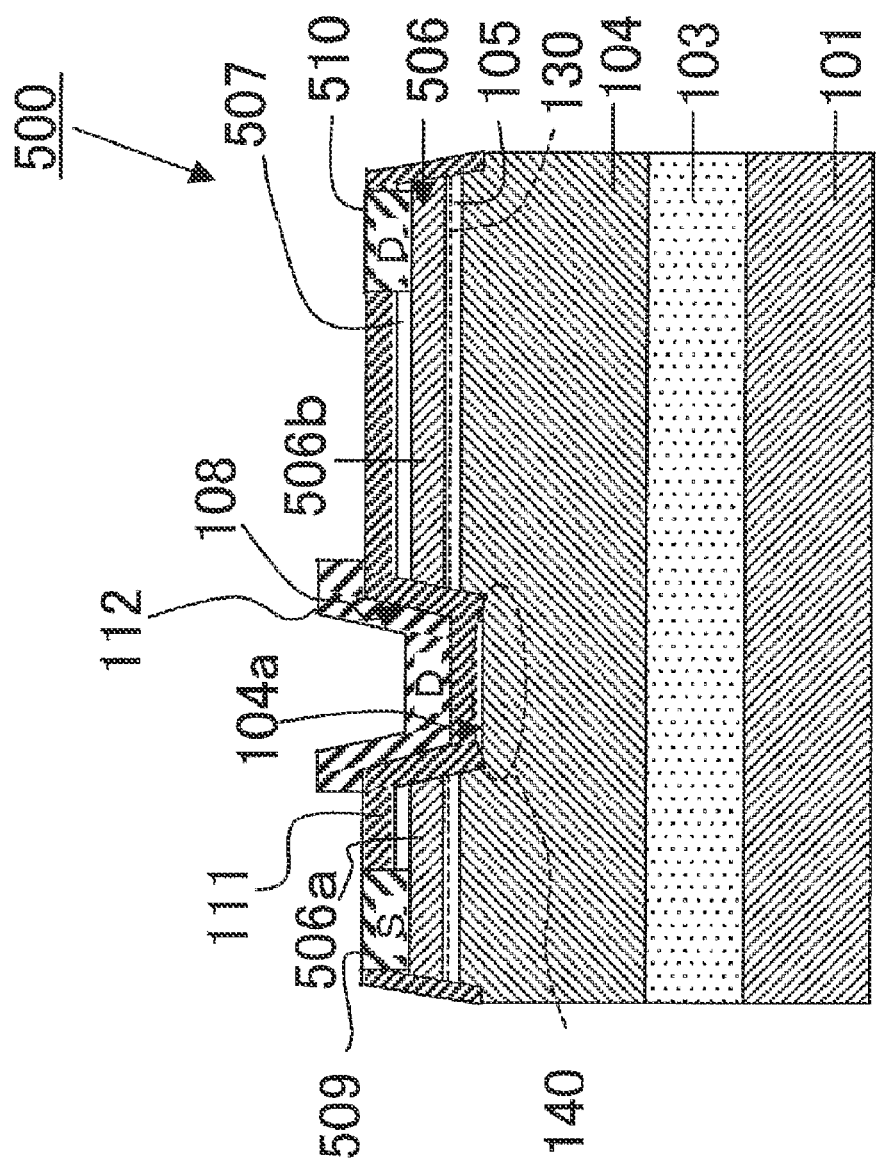
FIG. 9 schematically shows a cross sectional view of a MOSFET according to fifth embodiment of the invention.

In the following, a MOSFET according to a fifth embodiment of the present invention will be described. As shown in FIG. 9, a MOSFET 500 according to the fifth embodiment, a surface layer 507 of a portion where a source electrode 509 and a drain electrode 510 are formed is removed to form a recess section that extends to a electron supplying layer 506. The source electrode 509 and the drain electrode 510 are formed in a surface of the electron supply layer 506 in the recess section formed in the surface layer 507, but the rest of the structure is the same with the MOSFET 100 of the first embodiment.

By arranging as such, since the source electrode 509 and the drain electrode 510 directly contact the electron supply layer 506, it is advantageous in reducing Ohmic contact resistance of the source electrode and the drain electrode. Moreover, the recess Ohmic structure described in the present embodiment may be combined with the surface layer structure described in the above first to fourth embodiments.

Furthermore, the depth of the recess section that forms the source electrode 509 and the drain electrode 510 are good if it extends to at least the surface of the electron supply layer 506 and it may extend to the drift layer 105. In this case, since the band gap energy of the drift layer 105 is small compared to the electron supply layer 506, the drift layer 105 is easily Ohmic contacted with the electrodes and is able to form electrode by approaching near the two-dimensional electron gas layer 130, and thereby, further reduction of contact resistance is accomplished.

The GaN-based field effect transistor according to the invention is not limited to the above structure and may be combined with various structures used in the prior art. For example, in the fifth embodiment, Ohmic electrode is directly formed in the electron supply layer by etching the surface layer to reduce contact resistance, but n-type contact area of high concentration may be formed in the surface layer by methods such as ion implantation method, diffusion method, and selective growth method, to form the source electrode and the drain electrode on the contact area.

The invention may be modified as in the following to be embodied. With respect to above embodiments, an example of AlGaN/GaN has been described by way of a combination of the drift layer and the electron supply layer, while other than this, combination of materials like AlInGaN/GaN, GaN/InGaN, GaN/GaNAs, GaN/GaInNAsP, GaN/GaInNP, GaN/GaNP, AlGaNInNAsP/GaN, or AlGaN/AlInGaN, etc., can also be applied.

In the above embodiments, a spacer layer comprising, for instance, AlN, may be introduced in between the drift layer and the electron supply layer in order to improve the mobility of the two-dimensional electron gas layer.

Furthermore, in the above embodiments, $SiO_2$ is described as an example for the gate insulating film, material for insulating film other than $SiO_2$, such as AlN, $Al_2O_3$, $Ga_2O_3$, $TaO_x$, SiN, SiON, etc., can also be used. PCVD method is described as an example for method for forming $SiO_2$ film, methods such as APVCD method, sputtering method, ECR-sputtering method can also be used.

In the above first embodiment, the drift layer 105 comprising p-type or undoped GaN-based compound semiconductor whose impurity density is lower than that of the channel layer 104 is formed respectively between the channel layer 104, and the first electron supply layer 106a and the second electron supply layer 106b, but the present invention is not limited to such an arrangement. That is, the present invention is also applicable to MOSFETs with an arrangement in which there is no drift layer described in the above embodiments and in which the first electron supply layer 106a and the second electron supply layer 106b are formed respectively on the channel layer 104 comprised of p-type GaN-based compound semiconductor.

In accordance with the invention, since the density of surface traps between the semiconductor layer comprised of GaN-based compound semiconductor and the insulating film can be decreased, GaN-based field effect transistor with high voltage and low resistance and with lesser influence of current collapse phenomenon can be obtained.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A GaN-based field effect transistor, comprising:
a substrate;
a channel layer comprised of p-type or undoped GaN-based compound semiconductor material formed on the substrate;
an electron supply layer formed on the channel layer and comprised of GaN-based compound semiconductor material, the electron supply layer having bandgap energy greater than that of the channel layer;
a drift layer between the electron supply layer and the channel layer, comprising p-type or undoped GaN-based compound semiconductor material, the drift layer having bandgap energy smaller than that of the electron supply layer and impurity concentration lower than that of the channel layer;
a surface layer formed on the electron supply layer and comprised of GaN-based compound semiconductor material, the surface layer having bandgap energy smaller than that of the electron supply layer;
a first recess section having a surface of the channel layer as a bottom surface, exposed by removing a part of the surface layer, the electron supply layer and the drift layer;
an insulating film formed on the surface layer and an inner surface of the first recess section;
a gate electrode formed on the insulating film in the first recess section; and
a source electrode and a drain electrode electrically connected to the channel layer, the source electrode and the drain electrode being formed on respective sides of the gate electrode, on a surface of the electron supply layer in a second recess section and a third recess section respectively formed in the surface layer and on a same level.

2. The GaN-based field effect transistor according to claim 1, wherein
the surface layer is n-type or undoped GaN layer.

3. The GaN-based field effect transistor according to claim 1, wherein
the surface layer is an $Al_xGa_{1-x}N$ layer, and
the electron supply layer is an $Al_yGa_{1-y}N$ layer, where x<y.

4. The GaN-based field effect transistor according to claim 2, wherein
the electron supply layer is an $Al_zGa_{1-z}N$ layer, where $0 \leq z < 1$, in which composition ratio z for Al component decreases as approaching to its top surface, so that an uppermost surface of the electron supply layer is comprised of the surface layer comprising the n-type or undoped GaN.

5. The GaN-based field effect transistor according to claim 1, wherein
the surface layer has a thickness of around 20 nm.

6. The GaN-based field effect transistor according to claim 1, wherein
the surface layer separates the electron supply layer from the insulating film.

7. The GaN-based field effect transistor according to claim 6, wherein
the surface layer is an n-type or undoped GaN layer.

8. The GaN-based field effect transistor according to claim 6, wherein
the surface layer is an $Al_xGa_{1-x}N$ layer, and
the electron supply layer is an $Al_yGa_{1-y}N$, where $x<y$.

9. The GaN-based field effect transistor according to claim 7, wherein
the electron supply layer is an $Al_zGa_{1-z}N$ layer, where $0\leq z<1$, in which composition ratio z for Al component decreases as approaching to its top surface, so that an uppermost surface of the electron supply layer is comprised of the surface layer comprising the n-type or undoped GaN.

10. The GaN-based field effect transistor according to claim 6, wherein the surface layer has a thickness of around 20 nm.

11. A GaN-based field effect transistor, comprising:
a substrate;
a channel layer comprised of p-type or undoped GaN-based compound semiconductor material formed on the substrate;
an electron supply layer formed on the channel layer and comprised of GaN-based compound semiconductor material, the electron supply layer having bandgap energy greater than that of the channel layer;
a drift layer between the electron supply layer and the channel layer, comprising p-type or undoped GaN-based compound semiconductor material, the drift layer having bandgap energy smaller than that of the electron supply layer and impurity concentration lower than that of the channel layer;
a surface layer formed on the electron supply layer and comprised of GaN-based compound semiconductor material, the surface layer having bandgap energy smaller than that of the electron supply layer;
a first recess section having a surface layer, the electron supply layer and the drift layer;
an insulating film formed on the surface layer and an inner surface of the first recess section;
a gate electrode formed on the insulating film in the first recess section;
a source electrode and a drain electrode electrically connected to the channel layer, the source electrode and the drain electrode being formed on respective sides of the gate electrode and on a surface of the electron supply layer in a second recess section and a third recess section respectively formed in the surface layer.

12. A GaN-based field effect transistor, comprising:
a substrate;
a channel layer comprised of p-type or undoped GaN-based compound semiconductor material formed on the substrate;
an electron supply layer formed on the channel layer and comprised of GaN-based compound semiconductor material, the electron supply layer having bandgap energy greater than that of the channel layer;
a drift layer between the electron supply layer and the channel layer, comprising p-type or undoped GaN-based compound semiconductor material, the drift layer having bandgap energy smaller than that of the electron supply layer and impurity concentration lower than that of the channel layer;
a surface layer formed on the electron supply layer and comprised of GaN-based compound semiconductor material, the surface layer having bandgap energy smaller than that of the electron supply layer;
a first recess section having a surface of the channel layer as a bottom surface, exposed by removing a part of the surface layer, the electron supply layer and the drift layer;
an insulating film formed on the surface layer and an inner surface of the first recess section;
a gate electrode formed on the insulating film in the first recess section;
a source electrode and a drain electrode electrically connected to the channel layer, the source electrode and the drain electrode being formed on respective sides of the gate electrode and on a surface of the electron supply layer in a second recess section and a third recess section respectively formed in the surface layer.

* * * * *